United States Patent [19]

Payne

[11] 4,110,641
[45] Aug. 29, 1978

[54] CMOS VOLTAGE COMPARATOR WITH INTERNAL HYSTERESIS

[75] Inventor: Robert L. Payne, Crystal, Minn.

[73] Assignee: Honeywell Inc., Minneapolis, Minn.

[21] Appl. No.: 810,226

[22] Filed: Jun. 27, 1977

[51] Int. Cl.² .................... H03K 5/20; H03F 3/185; H03F 3/16; H03F 3/45
[52] U.S. Cl. .................... 307/355; 307/279; 307/288; 307/359; 330/253; 330/257; 330/277
[58] Field of Search ............ 307/270, 279, 288, 289, 307/290, 255, 355, 356, 358, 359, 360, 362, 363, 364; 330/253, 257, 264, 269, 277

[56] References Cited

U.S. PATENT DOCUMENTS

| | | | |
|---|---|---|---|
| 3,538,444 | 11/1970 | Adlhoch | 307/362 X |
| 3,725,673 | 4/1973 | Frederiksen et al. | 307/362 |
| 3,873,856 | 3/1975 | Gerlach | 307/290 X |
| 3,882,331 | 5/1975 | Sasaki | 307/290 X |
| 3,904,888 | 9/1975 | Griffin et al. | 307/288 X |
| 3,904,988 | 9/1975 | Hsiao | 307/359 X |
| 3,914,702 | 10/1975 | Gehweiler | 330/264 |
| 3,984,703 | 10/1976 | Jorgensen | 307/290 X |
| 4,013,898 | 3/1977 | Makino | 307/355 |
| 4,048,575 | 9/1977 | Musa | 330/253 |
| 4,069,431 | 1/1978 | Kucharewski | 307/355 |

Primary Examiner—Larry N. Anagnos
Attorney, Agent, or Firm—Albin Medved

[57] ABSTRACT

A CMOS voltage comparator with internal positive current feedback to achieve a predetermined hysteresis. The voltage level at which the switching occurs is precisely settable. Hysteresis is introduced such that when the set voltage level is exceeded, the output switches quickly and will remain in that state until the input voltage drops by a predetermined hysteresis voltage.

8 Claims, 1 Drawing Figure

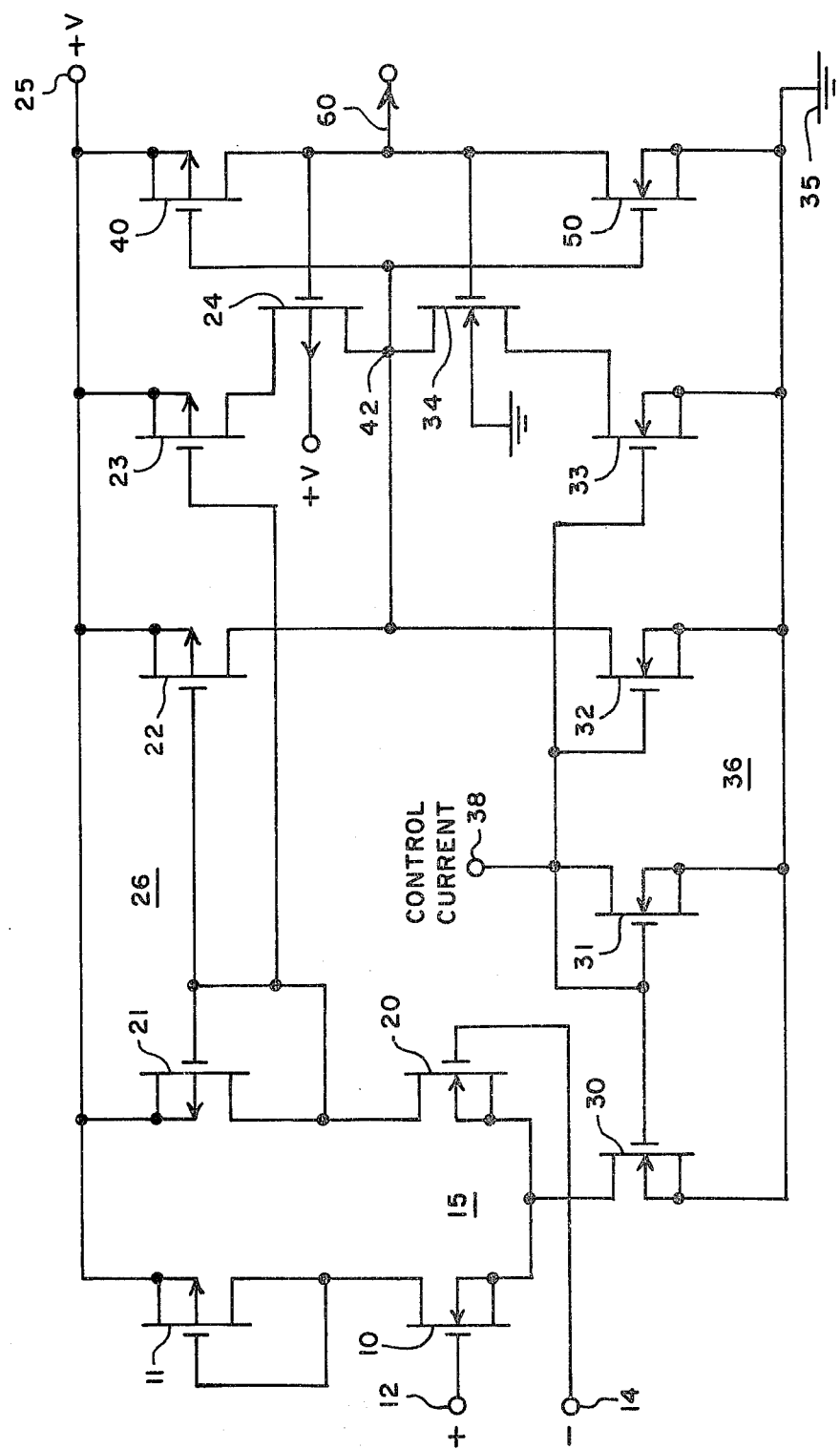

CMOS VOLTAGE COMPARATOR WITH INTERNAL HYSTERESIS

BACKGROUND OF THE INVENTION

1. Field of the Invention

The present invention relates to integrated circuits and more particularly to circuits employing complementary metal oxide semiconductors. More specifically, the present invention pertains to circuits exhibiting hysteresis such that the output switches between high and low voltage levels in response to input voltage causing the switching to occur in a first direction at an input voltage which differs from the voltage causing switching in the opposite direction by an incremental hysteresis voltage.

2. Description of the Prior Art

Hysteresis circuits of various types are well known in the prior art. An example of such prior art is U.S. Pat. No. 3,904,888 which shows a circuit exhibiting hysteresis using transistors of complementary conductivity types. A disadvantage of such prior art is that the differential amplifier input switching point cannot be precisely controlled and is highly variable.

SUMMARY OF THE INVENTION

The present invention relates to a comparator with internal hysteresis realized by CMOS techniques employing insulated gate field effect transistors. The circuit is comprised of a differential amplifier for receiving the input signal, an output inverter circuit for switching the output between high and low voltage levels in response to the signal received at the input of the differential amplifier and an internal current feedback network for introducing a prescribed offset unbalance in the differential amplifier to obtain hysteresis.

The current flowing through the input differential amplifier is established by a constant current source acting through a current mirror. The voltage applied to the input of the differential amplifier determines what fraction of the total current flows through each of the two branches of the amplifier. In addition to determining the level of the current flow through the differential amplifier, the constant current source establishes a first hysteresis feedback current. A second hysteresis feedback current is controlled by the current flowing through one of the two legs of the differential amplifier. A switching circuit is provided for connecting into the circuit the first or the second feedback current, depending upon the state of the output inverter circuit.

It is therefore an object of the present invention to provide a comparator circuit with internal hysteresis using CMOS techniques. A further object of the present invention is to provide a comparator circuit with internal hysteresis with a precisely settable voltage switching level. A still further object of the present invention is to provide a comparator circuit with internal hysteresis with low current consumption and which obtains hysteresis without affecting the loading at the input. These and further objects will become apparent to those skilled in the art upon examination of the following specification, claims, and drawing.

BRIEF DESCRIPTION OF THE DRAWING

The FIGURE in the drawing is a schematic circuit diagram illustrating the preferred embodiment of the present invention.

DESCRIPTION OF THE PREFERRED EMBODIMENT

The drawing illustrates a comparator with internal hysteresis in accordance with the present invention. It includes an input differential pair 15 comprised of N-channel insulated gate field effect transistors 10 and 20. The comparator further includes a first current mirror circuit 36 comprised of N-channel field effect transistors 30, 31, 32, and 33 and a second current mirror circuit 26 comprised of insulated gate P-channel field effect transistors 21, 22 and 23. Also included are a switching circuit comprised of a P-channel field effect transistor 24 and an N-channel field effect transistor 34, and an output inverter circuit comprised of P-channel field effect transistor 40 and N-channel field effect transistor 50.

The source electrodes of transistors 10 and 20 are connected to each other and also to the drain electrode of transistor 30 in current mirror circuit 36. The drain electrode of transistor 10 is connected to the drain electrode of transistor 11, while the drain electrode of transistor 20 is connected to the drain electrode of transistor 21.

In current mirror circuit 36, the source electrodes of transistors 30, 31, 32, and 33 are connected to a terminal 35 for connection to the power source. The gate electrodes of transistors 30 through 33 are connected to each other and also to the drain electrode of transistor 31, which in turn is connected to a source of control current 38. The theory and operation of current mirrors can be found in "Linear Integrated Circuits and MOS Application Devices", RCA Solid State 1974 Databook Series, page 77. The operation of a current mirror is such that the magnitude of the current established in transistor 31 will also determine the current flowing through transistors 30, 32, and 33. In other words, the currents through transistors 30, 32, and 33 are reflections of the current conducted by transistor 31, the relationships of these currents to the current conducted by transistor 31 being dependent on the physical constants associated with the individual transistors.

A second current mirror 26 is constructed of P-channel field effect transistors 21, 22 and 23. The source electrodes of transistors 21, 22, and 23 are connected to positive potential terminal 25, while the gate electrodes are connected to each other and also to the drain electrode of transistor 21. The drain electrode of transistor 22 is connected to the drain electrode of transistor 32 in current mirror 36 and to a common junction terminal 42, which in turn is connected directly to gate electrodes of P-channel field effect transistor 40 and N-channel field effect transistor 50 which form the output inverter.

Transistors 40 and 50 of the output inverter have their drain electrodes connected to each other and to an output terminal 60. The drain electrodes of transistors 40 and 50 are further connected to gate electrodes of a P-channel insulated gate field effect transistor 24 and an N-channel insulated gate field effect transistor 34. Transistors 24 and 34 form a switching circuit, whose function it is to close and open current paths for the hysteresis feedback current, as will be described later. Transistor 24 has its source connected to the drain of transistor 23 in current mirror 26 and the transistor 34 has its source connected to the drain of transistor 33 in current mirror 36. The drain electrodes of transistors 24 and 34 are connected to common junction terminal 42. Transistor 11 is used to equalize the bias condition on the differential transistor pair 15. The source electrode of transistor 11 is connected to terminal 25 and the gate electrode is connected to its drain electrode.

The sum of the currents flowing through transitors 10 and 20 of differential pair 15 is determined by transistor 30, the current flow through which, in turn, is a reflection of the current through transistor 31. As mentioned above, transistors 30, 31, 32, and 33 are connected to form current mirror 36, the currents through each of these transistors being proportionately dependent on the value of the control current applied to the drain of transistor 31. When the voltage signals applied to input terminals 12 and 14 of differential pair 15 are equal, the current flowing through transistors 10 and 20 are approximately equal, each current being equal to approximately one-half of the current flowing through transistor 30. However, as the voltage at one of the terminals increases or decreases, the current in one of the differential amplifier transistors will increase, while the current in the other transistor will decrease. The sum of the two currents will remain constant, as determined by transistor 30.

Variations in the current through transistor 20 in turn produces corresponding variations in the current through transistor 21, since transistors 20 and 21 are connected in a series path. Current mirror 26, consisting of transistors 21, 22, and 23, is connected in such a way that the currents in transistors 22 and 23 are determined by the current through transistor 21. It is quite clear then that the currents in transistors 21, 22, and 23 are a function of the control current 38 and of the differential voltage applied to input terminals 12 and 14.

Differential pair 15 and transistors 21, 22, 30, 31, and 32 of current mirrors 26 and 36 comprise a transconductance amplifier. The gain of the transconductance amplifier is represented by the incremental change in current flow through transistor 22 in current mirror 26 as a function of an incremental change in the voltage at input terminals 12 and 14. The magnitude of the transconductance amplifier output current through transistor 22, together with hysteresis currents through transistors 23 or 33, establishes the potential at common junction terminal 42 and at the gate electrodes of transistors 40 and 50 in the output inverter, thereby controlling the switching of transistors 40 and 50. The hysteresis feedback current through transistor 23 can flow only when transistor 24 is conducting, and the hysteresis feedback current through transistor 33 can flow only when transistor 34 is conducting. As mentioned before, transistors 24 and 34 form a switching circuit, controlled by the voltage at output 60. When the voltage at common junction terminal 42 is sufficiently low, transistor 40 in the output inverter is conducting and transistor 50 is non-conducting. In this condition, the voltage at output 60 is high, close to the potential of terminal 25. When the voltage at junction terminal 42 is high, transistor 50 is conducting and transistor 40 is non-conducting, rendering the voltage at output 60 to be low, close to the potential of terminal 35. The voltage at output 60 is applied to control electrodes of switching transistors 24 and 34. When the voltage at output 60 is high, transistor 34 conducts and transistor 24 is turned off. In the reverse condition, when the voltage at input 60 is low, transistor 24 conducts and transistor 34 is turned off.

As the voltage at input terminal 14 increases, transistor 20 in differential amplifier 15 becomes more conductive, causing a greater current to flow through transistors 20 and 21 and a proportionately smaller current to flow through transistors 10 and 11. Through the action of current mirror 26, the increased current through transistor 21 results in proportionately increased currents in transistors 22 and 23, resulting further in the lowering of the potential at junction terminal 42. As the voltage at input terminal 14 continues to increase, the voltage at junction terminal 42 will eventually drop to a level sufficiently low to cause transistor 40 in the output inverter to start conducting and transistor 50 to be turned off. As transistors 40 starts conducting, the voltage at output terminal 60 increases, in turn turning on switching transistor 34 and allowing the hysteresis feedback current to flow through transistor 33. The flow of hysteresis feedback current through transistor 33 further lowers the potential at junction terminal 42, assuring that transistor 40 will be fully turned on and transistor 50 will be fully turned off.

As the voltage at input terminal 14 decreases, decreasing current through transistor 22 will result in a corresponding voltage at junction terminal 42 until the voltage increases to a level sufficient to cause transistor 50 in the output inverter to conduct and transistor 40 to turn off. Because of the additional current flow through transistor 33, the negative-going voltage at input terminal 14 which will result in the switching of output transistors 40 and 50 in the output inverter will have to be lower than the voltage causing switching in the positive-going direction. As the voltage at junction terminal 42 increases to a sufficient level, transistor 50 turns on causing the voltage at output 60 to go low. The low voltage at output terminal 60 turns on switching transistor 24 and turns off switching transistor 34. The hysteresis feedback current through transistor 33 is thereby removed from the circuit and a second hysteresis feedback current flowing through transistor 23 is allowed to flow between positive terminal 25 and junction terminal 42. The flow of current through transistor 23 further increases the potential at junction terminal 42, assuring that transistor 50 is fully turned on and transistor 40 is fully turned off.

Again, as the voltage signal across the input terminals 12 and 14 increases in the positive direction, the switching at output terminal 60 will be displaced by an incremental voltage required to overcome the additional current flow through transistor 23. It can be seen, therefore, that the amount of displacement in the voltage signal appearing at the input required to switch output transistors 40 and 50 is a function of the magnitude of hysteresis feedback currents through transistors 23 and 33. The magnitude of these currents is, as has been shown previously, controllable through variations in control current applied to terminal 38 of current mirror 36.

The foregoing specification describes an improved voltage comparator with internal positive current feedback achieving a predetermined hysteresis which is controllable by an input current.

Various modifications of the inventive concept will be obvious to those skilled in the art without departing from the spirit of the invention. It is intended that the scope of the invention be limited only by the following claims.

What is claimed is:

1. A CMOS comparator with internal positive current feedback for generating hysteresis in the switching of the output voltage signal as a function of the input voltage signal, said comparator comprising:

a transconductance amplifier for generating a current through a first insulated gate field effect transistor which is a function of voltage at its input, said first insulated gate field effect transistor having its source connected to a first potential terminal and having its drain connected to a common junction terminal;

a second insulated gate field effect transistor having its source to drain conduction path connected between said common junction terminal and a second potential terminal;

a source of control current;

means for generating a first feedback current as a function of said control current;

an output terminal;

an output inverter comprised of third and fourth insulated gate field effect transistors, said third transistor having its source to drain conductive path connected between said output terminal and said first potential terminal and said fourth transistor having its source to drain conductive path connected between said output terminal and said second potential terminal, said third and fourth transistors further having their gate electrodes connected to said common junction terminal; and switching means connected to said means for generating said first feedback current and to said output terminal for connecting said first feedback current in parallel with said first transistor as a function of voltage at said output terminal.

2. Apparatus according to claim 1, wherein means are provided for generating a second feedback current as a function of said control current and said switching means is further connected to said means for generating said second feedback current for alternately connecting said first feedback current in parallel with said first transistor and said second feedback current in parallel with said second transistor as a function of voltage at said output terminal.

3. Apparatus according to claim 1, wherein said transconductance amplifier includes a differential transistor pair comprised of fifth and sixth insulated gate field effect transistors having their gate electrodes connected to first and second input terminals, respectively, having their drain electrodes connected to said first potential terminal via seventh and eighth insulated gate field effect transistors, and having their source electrodes connected to each other and to said second potential terminal via a ninth insulated gate field effect transistor.

4. Apparatus according to claim 3, including a first current mirror comprised of said second and ninth transistors, together with tenth and eleventh insulated gate field effect transistors, said tenth insulated gate field effect transistor having its drain electrode connected to said source of control current and to the gate electrodes of said second, ninth, tenth, and eleventh transistors, each of said transistors in said second current mirror further having its source connected to said second potential terminal, whereby the currents conducted by said second, ninth, and eleventh transistors are reflections of the current conducted by said tenth transistor and are thereby a function of said control current.

5. Apparatus according to claim 4, including a second current mirror comprised of said first and eighth insulated gate field effect transistors and a twelfth insulated gate field effect transistor, said first, eighth and twelfth transistors having their gate electrodes connected to each other and to the drain electrode of said eighth transistor, and having their source electrodes connected to said first potential terminal, whereby the currents conducted by said first and twelfth transistors are a reflection of the current conducted by said eighth transistor.

6. Apparatus according to claim 5, wherein said eleventh and twelfth insulated gate field effect transistors represent said means for generating a second feedback current and said means for generating a first feedback current, respectively.

7. Apparatus according to claim 6, wherein said switching means includes thirteenth and fourteenth insulated gate field effect transistors, said thirteenth transistor having its source connected to the drain of said twelfth transistor, having its drain connected to said common junction terminal and having its gate connected to said output terminal and said fourteenth transistor having its source connected to the drain of said eleventh transistor, having its drain connected to said common junction terminal, and having its gate connected to said output terminal.

8. Apparatus according to claim 7, wherein said first, third, seventh, eighth, twelfth and thirteenth insulated gate field effect transistors are of the first polarity type and said second, fourth, fifth, sixth, ninth, tenth, eleventh, and fourteenth insulated gate field effect transistors are of the second polarity type.

* * * * *